US010545059B2

(12) United States Patent
Tian

(10) Patent No.: US 10,545,059 B2
(45) Date of Patent: Jan. 28, 2020

(54) PIEZOELECTRIC ELEMENT HAVING IMPROVED SENSITIVITY, METHOD FOR MANUFACTURING THE SAME AND PIEZOELECTRIC SENSOR

(71) Applicant: BOE TECHNOLOGY GROUP CO., LTD., Beijing (CN)

(72) Inventor: Xueyan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 10 days.

(21) Appl. No.: 15/535,423

(22) PCT Filed: Aug. 18, 2016

(86) PCT No.: PCT/CN2016/095853
§ 371 (c)(1),
(2) Date: Jun. 13, 2017

(87) PCT Pub. No.: WO2017/118032
PCT Pub. Date: Jul. 13, 2017

(65) Prior Publication Data
US 2018/0106689 A1    Apr. 19, 2018

(30) Foreign Application Priority Data
Jan. 4, 2016 (CN) .......................... 2016 1 0003582

(51) Int. Cl.
*G01L 9/08* (2006.01)
*H01L 41/04* (2006.01)
(Continued)

(52) U.S. Cl.
CPC ............ *G01L 1/16* (2013.01); *H01L 41/0475* (2013.01); *H01L 41/0478* (2013.01);
(Continued)

(58) Field of Classification Search
CPC ......... G06F 3/0414; G06F 2203/04103; G06F 1/16; G06F 2203/04102; Y10T 29/49105;
(Continued)

(56) References Cited

U.S. PATENT DOCUMENTS 8,310,017 B2   11/2012  Mori
8,476,804 B2*  7/2013  Hishinuma ............ H01G 5/16
                                                   310/324
2010/0253184 A1* 10/2010 Choi .................. H02N 2/18
                                                   310/339
2011/0083446 A1   4/2011  Mori
(Continued)

FOREIGN PATENT DOCUMENTS

CN    201429482 Y    3/2010
CN    104374498 A    2/2015
(Continued)

OTHER PUBLICATIONS

First Office Action for U.S. Patent Application Serial No. 201610003582.8 dated Jan. 13, 2017.
Search Report for International Application No. PCT/CN2016/095853 dated Nov. 25, 2016.
(Continued)

*Primary Examiner* — Brandi N Hopkins
(74) *Attorney, Agent, or Firm* — Calfee, Halter & Griswold LLP

(57) ABSTRACT

A piezoelectric element includes: a piezoelectric part; a first substrate and a second substrate, provided at both sides of the piezoelectric part, respectively; a first electrode layer, located between the first substrate and the piezoelectric part; and a second electrode layer, located between the electrode substrate and the piezoelectric part, wherein a surface of at least one of the first substrate and the second substrate close to the piezoelectric part is provided with a convex portion.

17 Claims, 4 Drawing Sheets

(51) Int. Cl.
  *H01L 41/047* (2006.01)
  *G01L 1/16* (2006.01)
  *H01L 41/113* (2006.01)
  *H01L 41/187* (2006.01)
  *H01L 41/29* (2013.01)
  *H01L 41/312* (2013.01)
  *H01L 41/333* (2013.01)
  *H01L 41/335* (2013.01)

(52) U.S. Cl.
  CPC ...... *H01L 41/1132* (2013.01); *H01L 41/1871* (2013.01); *H01L 41/29* (2013.01); *H01L 41/312* (2013.01); *H01L 41/333* (2013.01); *H01L 41/335* (2013.01)

(58) Field of Classification Search
  CPC ................ H01H 2201/036; G01L 1/20; H01C 17/0652; H01C 17/06586
  See application file for complete search history.

(56) References Cited

U.S. PATENT DOCUMENTS

| 2011/0084346 | A1 | 4/2011 | Mori |
| 2011/0204317 | A1* | 8/2011 | Park ................ B82Y 30/00 257/9 |
| 2015/0277647 | A1 | 10/2015 | Ogura et al. |

FOREIGN PATENT DOCUMENTS

| CN | 104951172 A | 9/2015 |
| CN | 105021329 A | 11/2015 |
| CN | 105067159 A | 11/2015 |
| CN | 105651429 A | 6/2016 |

OTHER PUBLICATIONS

First Office Action for Chinese Patent Application No. 201610003582.8 dated Jan. 13, 2017.

* cited by examiner

PIEZOELECTRIC ELEMENT HAVING IMPROVED SENSITIVITY, METHOD FOR MANUFACTURING THE SAME AND PIEZOELECTRIC SENSOR

CROSS REFERENCE

This application is based upon International Application No. PCT/CN2016/095853, filed on Aug. 18, 2016, which claims priority to Chinese Patent Application No. 201610003582.8, filed on Jan. 4, 2016, the contents thereof are incorporated herein by reference in its entirety as a part of this application.

TECHNICAL FIELD

The present disclosure relates to a field of self-generating sensor technology, and more particularly, to a piezoelectric element, a method for manufacturing the same and a piezoelectric sensor.

BACKGROUND

It is an effective way to achieve green energy and the sustainable development of energy by collecting energy from the living environment, which has been paid attention to by the whole world. The piezoelectric technology, as a new energy development technology, is widely used in various industrial fields and expected to play important roles in environmental monitoring, energy-saving systems, implantable medical means, and even consumer electronics.

The piezoelectric technology is the technology based on a piezoelectric effect. When the dielectric is deformed due to an external force in a certain direction, its interior will generate polarization phenomenon, and positive and negative charges will appear on its two opposite surfaces. When the external force is removed, it will return to a non-charged state, and this phenomenon is called a positive piezoelectric effect. When the direction of the acting force changes, the polarity of the charge also changes.

It can be understood that the essence of the piezoelectric effect is that the mechanical action causes dielectric polarization. As for the displacement of the ionic charge in the crystal, when no strain exists, the distribution of charges on lattice positions is symmetrical, its internal electric field is zero. When a stress is applied to the crystal, the charge is displaced. If the charge distribution is no longer symmetrical, the net polarization occurs and produces an electric field accordingly. The electric field will appear as the piezoelectric effect. A type of sensor developed based on the piezoelectric effect of the dielectric is called a piezoelectric sensor.

When a conventional piezoelectric element is in use, wires are usually connected to upper and lower surfaces of a piezoelectric part of the piezoelectric element to form a loop, and the charge generated by the piezoelectric effect is derived through the wires, to supply to loads for use. The existing piezoelectric element has low sensitivity.

It should be noted that, information disclosed in the above background portion is provided only for better understanding of the background of the present disclosure, and thus it may contain information that does not form the prior art known by those ordinary skilled in the art.

SUMMARY

Embodiments of the present disclosure provide a piezoelectric element, a method for manufacturing the same and a piezoelectric sensor.

According to an aspect of the present disclosure, there is provided a piezoelectric element, comprising:
 a piezoelectric part;
 a first substrate and a second substrate, provided at both sides of the piezoelectric part, respectively;
 a first electrode layer, located between the first substrate and the piezoelectric part; and
 a second electrode layer, located between the electrode substrate and the piezoelectric part,
 wherein a surface of at least one of the first substrate and the second substrate close to the piezoelectric part is provided with a convex portion.

According to another aspect of the present disclosure, there is provided a method for manufacturing a piezoelectric element, comprising:
 providing a piezoelectric part;
 forming a first substrate and a second substrate, a first surface of at least one of the first substrate and the second substrate having a convex portion;
 forming a first electrode layer and a second electrode layer on the first surfaces of the first substrate and the second substrate, respectively; and
 arranging the first substrate and the second substrate at both sides of the piezoelectric part, such that the first electrode layer is located between the first substrate and the piezoelectric part, and the second electrode layer is located between the piezoelectric part and the electrode substrate.

According to yet another aspect of the present disclosure, there is provided a piezoelectric sensor, comprising any one of the above piezoelectric elements.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to clarify technical aspects in embodiments of the present disclosure more clearly, drawings which are needed for the description of the embodiments are briefly described hereinafter. It will be apparent that the drawings in the following description are merely some embodiments of the present disclosure. Other drawings may be obtained according to these drawings by those skilled in the art, without creative labor.

Throughout various figures of the drawings, corresponding reference numerals denote corresponding parts or features.

DETAILED DESCRIPTION

Figure 1:
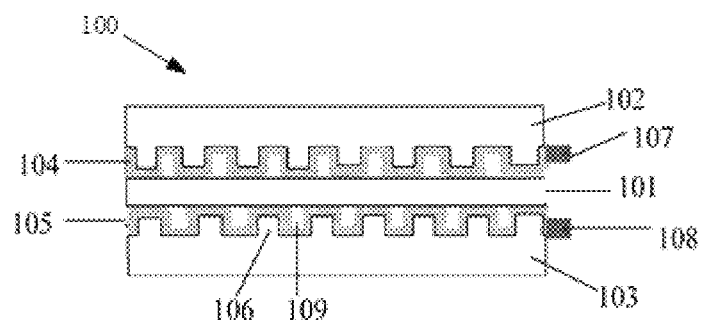
FIG. 1 shows a cross-sectional schematic view of a piezoelectric element according to an embodiment of the present disclosure.

In order to make objectives, technical solutions and advantages of the present disclosure more apparent, embodiments of the present disclosure will be described in further detail below with reference to the accompanying drawings. It is to be understood that, the described embodiments are a part of embodiments of the present disclosure, rather than all embodiments. All other embodiments obtained based on the described embodiments of the present disclosure by those skilled in the art without creative labor are within the scope of the present disclosure.

It should be noted that, various layers or regions shown in the drawings are not drawn to scale. Besides, for ease of explanation, only one or more layers or regions of the type commonly used in such a piezoelectric element are explicitly shown or described in given figures or embodiments. In particular, for processing steps, the description provided herein is not intended to encompass all processing steps that may be required to form the piezoelectric element. More specifically, in order to simplify the description, specific processing steps commonly used in forming the piezoelectric element are not described herein on purpose. However, those skilled in the art will readily recognize those processing steps omitted from these general description.

FIG. 1 shows a cross-sectional schematic view of a piezoelectric element according to an embodiment of the present disclosure.

As shown in FIG. 1, in the embodiment of the present disclosure, there is provided a piezoelectric element 100. The piezoelectric element 100 comprises a piezoelectric part 101, a first substrate 102, a second substrate 103, a first electrode layer 104 and second electrode layer 105. In the embodiment, the first substrate 102 and the second substrate 103 are located at both sides of the piezoelectric element 101, respectively. Besides, surfaces of the first substrate 102 and the second substrate 103 close to the piezoelectric part are provided with a plurality of convex portions 106, respectively, such that the surfaces of the first substrate 102 and the second substrate 103 close to the piezoelectric part are non-flat surfaces. The first electrode layer 104 is located between the first substrate 102 and the piezoelectric part 101, and the second electrode layer 105 is located between the second substrate 103 and the piezoelectric part 101.

In the embodiment of the present disclosure, the first substrate and the second substrate whose surfaces are provided with convex portions are arranged at both sides of the piezoelectric part, such that the surfaces of the first and second substrates are non-flat surfaces. When a pressure is applied, the substrate is susceptible to be deformed to produce a pressure on the piezoelectric part, thereby causing the piezoelectric part to generate a piezoelectric effect. Therefore, a current is generated, and then the current is derived by an electrode between the substrate and the piezoelectric part, to supply to loads for use. According to the embodiment of the present disclosure, even a relatively small pressure is sensible by the piezoelectric element of such a structure, so that the sensitivity of the piezoelectric element may be improved.

It will be understood by those skilled in the art that, in the embodiment of the present disclosure, the convex portion 106 on the surfaces of the first substrate 102 and the second substrate 103 may be a plurality of convex portions provided on a flat surface, and it may also be a concave portion on the surface. The portion except for the concave portion is called a convex portion 106. The embodiment of the present disclosure does not limit a formation manner of the convex portion, as long as surfaces of the first substrate 102 and the second substrate 103 close to the piezoelectric part 101 are non-flat surfaces.

In an embodiment of the present disclosure, as shown in FIG. 1, the first electrode layer 104 may be arranged to be attached to a surface having the convex portion 106 of the first substrate 102, such that a surface shape of the first electrode layer 104 is adapted to a shape of the surface of the first substrate 102 on which the first electrode layer 104 is positioned. Besides, the second electrode layer 105 is arranged to be attached to a surface having the convex portion 106 of the second substrate 103, such that a surface shape of the second electrode layer 105 is adapted to a shape of the surface of the second substrate 103 on which the second electrode layer 105 is positioned. In this way, the performance of the piezoelectric element provided by the embodiment of the present disclosure may be further improved, and the manufacturing process may be simplified.

In one embodiment, the first electrode layer 104 and the second electrode layer 105 may be adhered to both sides of the piezoelectric part 101 by a conductive paste, respectively, so that the first electrode layer 104 and the second electrode layer 105 may be better bonded to the piezoelectric part. It is possible to improve the utilization ratio of the electric quantity generated by the piezoelectric part.

Figure 6:
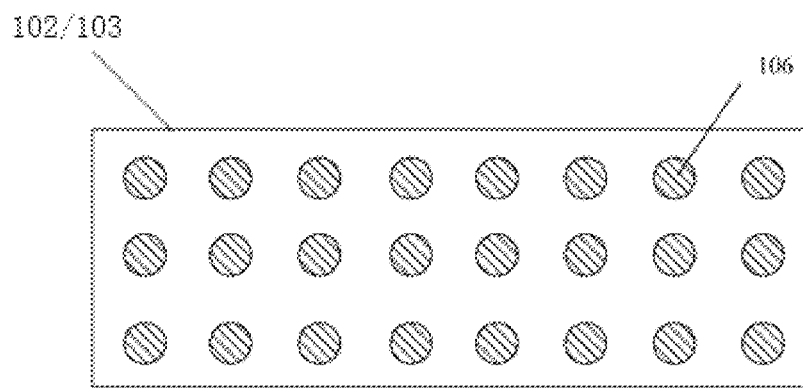
FIG. 6 shows a top view of a surface having a convex portion of a substrate according to an embodiment of the present disclosure.

In one embodiment, the convex portion 106 may have a columnar structure. In a further embodiment, the plurality of convex portions may be arranged in an array on the first substrate 102 and the second substrate 103, as shown in FIG. 6.

Figure 7:
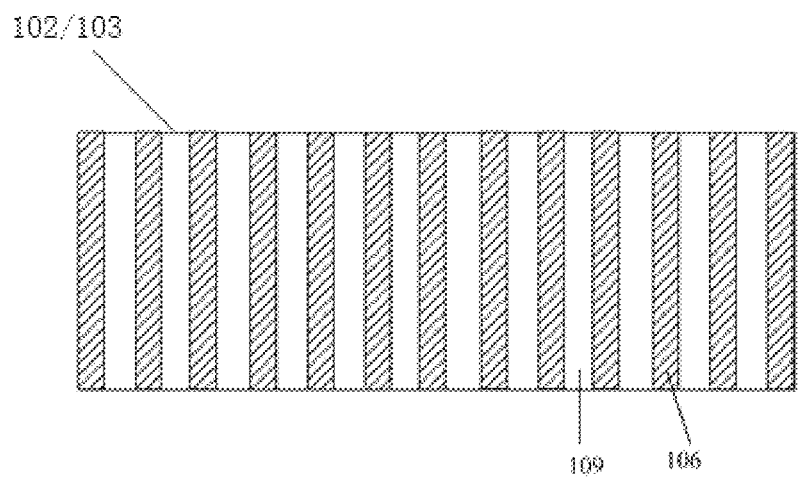
FIG. 7 shows a top view of a surface having a convex portion of a substrate according to another embodiment of the present disclosure.

In one embodiment, the surfaces of the first substrate 102 and the second substrate 103 have projection portions 106 and concave portions 109. Shapes or structures of the projection portions 106 and concave portions 109 are configured such that the surfaces of the first substrate 102 and the second substrate 103 are wave-shaped surfaces, such as a rectangular wave, a sawtooth wave, or the like. In a specific embodiment, as shown in FIGS. 1 and 7, the convex portion 106 extends in a plane parallel to a surface (e.g., an upper surface) of the piezoelectric part 101, and a portion between two adjacent convex portions 106 is a concave portion 109. In other words, the portion between two adjacent concave portions 109 is a convex portion 106. As an optional embodiment, the convex portion 106 and the concave portion 109 extend in a direction parallel to a side of the piezoelectric part 101.

It will be understood by those skilled in the art that, shapes and structures of the convex portion 106 and the concave portion 109 are not limited to the shapes and structures shown in the drawings. For example, their cross sections may also be, for example, polygonal, oval, and other regular or irregular shapes, and so on. In addition, these convex portions may be equally spaced apart or may be unequally spaced, and the present application is not limited thereto.

It is to be noted that, in the embodiment of the present disclosure, the convex portion 106 and the concave portion 109 may be provided on the surface of only any one of the first substrate 102 and the second substrate 103 close to the piezoelectric part 101, instead of arranging the convex portion and the concave portion on surfaces of both of the first substrate 102 and the second substrate 103. Moreover, in an optional embodiment of the present disclosure, the number of the convex portions and concave portions is not limited, which may be one, two or more.

In an embodiment, the first substrate 102 and the second substrate 103 may be a flexible substrate or an elastic substrate, i.e., made of a flexible material or an elastic material. Optionally, the first substrate 102 or the second substrate 103 is a (polydimethylsioxane, PDMS) substrate. The PDMS is a new type of high-molecular polymer material, which has two liquid components of a base and a curing agent, which may be mixed in a certain proportion when used. For example, the proportion of the base and curing agent may be 10:1, and may be formed to be a flexible, transparent plastic block through heating and curing at a certain temperature. The first substrate 102 and the second substrate 103 formed of this material have good elasticity and transparency and are safe and non-toxic, have little or even no harm to the human body, and therefore may be applied to implantable medical apparatus and instruments. In addition, since the substrate formed of such a material has good elasticity, the substrate is deformed when a pressure is applied thereto, and then the pressure is transmitted to the piezoelectric part, to cause the piezoelectric part to generate a piezoelectric effect. Therefore, the sensitivity of the piezoelectric element may be improved.

In one embodiment, at least one of the first electrode layer 104 and the second electrode layer 105 may comprise a carbon nanotube (CNT) electrode. Optionally, both of the first electrode layer 104 and the second electrode layer 105 are formed of carbon nanotube materials. Optionally, the first electrode layer 104 and the second electrode layer 105 have thicknesses in the range of 30 nm to 70 nm.

Currently, the application prospect of carbon nanotubes in medical and other areas is highly anticipated. The carbon nanotubes have excellent flexibility and photoelectric properties. The carbon nanomaterial becomes outstanding in the biological nanomaterial because of its high stability and good biocompatibility, which may be used as the basic material for preparation of tissue engineering cell growth stents, artificial blood vessels, drug carriers and the like. In the present application, as an optional embodiment, the first electrode layer and the second electrode layer may be formed by using one type of material in the carbon nanotubes, i.e., a single-wall carbon nanotube/SWNT (and a material having a high metal matrix content).

As described above, the CNT has good photoelectric properties, stretchability and biocompatibility, therefore, on one hand, by using the CNT (optionally, SWNT) to form the first or second electrode, the conductivity of the electrode to the charge generated in the piezoelectric effect may be improved, thus improving the efficiency of the piezoelectric element, and on the other hand, the electrode formed with the CNT (optionally, SWNT) has good biocompatibility, which is applicable to the biomedicine field, particularly in the implantable medical apparatus and instruments.

In the embodiment of the present disclosure, the above piezoelectric part may be a piezoelectric ceramic layer comprising at least one of a barium zirconate titanate (Ba (Zr$_{0.1}$, Ti$_{0.9}$) O$_3$, BZT) layer and a barium titanate (Ba (Ca$_{0.1}$, Ti$_{0.9}$) O$_3$, BCT) layer. In the embodiment of the present disclosure, the piezoelectric part may be prepared through a sol-gel method. Because the BZT and BCT have high piezoelectric and dielectric constants, a leakage current is very small, the sensitivity and efficiency of piezoelectric element may be improved. Moreover, the BZT and BCT are lead-free materials, which have good biocompatibility, suitable for biological and medical fields.

It is to be understood that, the forming material of the piezoelectric part is not limited to the above-mentioned ceramic materials, and it may also be formed of any material available to those skilled in the art, such as quartz crystal.

Figure 2:
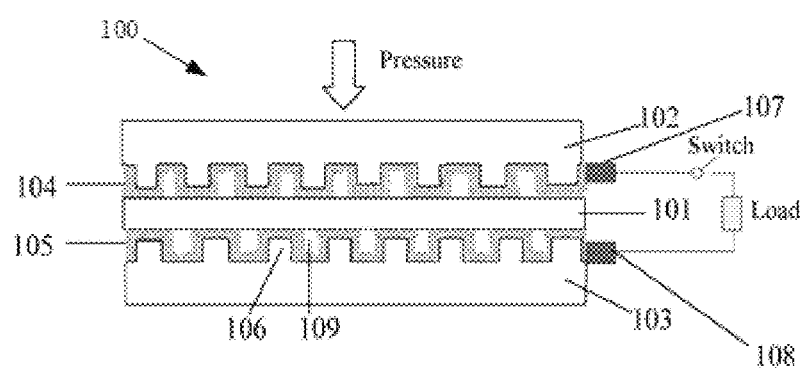
FIG. 2 shows a schematic diagram of a piezoelectric element connected to a load according to an embodiment of the present disclosure.

As shown in FIGS. 1 and 2, in the embodiment of the present disclosure, the above-mentioned piezoelectric element further comprises a first electrode leading-out terminal 107 and a second electrode leading-out terminal 108, which may be formed by a spraying process and are electrically connected to the first electrode 104 and the second electrode 105, respectively. During actual operations, as shown in FIG. 2, the load can be connected to the first electrode 104 and the second electrode 105 through the first electrode leading-out terminal 107 and the second electrode leading-out terminal 108. When a pressure is applied to the substrate of the piezoelectric element (as shown in FIG. 2), the current generated by the piezoelectric element may be supplied to the load through the first electrode leading-out terminal 107 and the second electrode leading-out terminal 108. As an alternative, the first electrode leading-out terminal 107 and the second electrode leading-out terminal 108 may also be formed of carbon nanotube materials. By adopting the carbon nanotube material to form the electrode leading-out terminal, the conductivity of the electrode leading-out terminal may be increased. In addition, by forming the electrode layer and the electrode leading-out terminal with the same material, the electrode leading-out terminal may be formed at the same time as the process of forming the electrode layer, so that the manufacturing process may be simplified.

In one embodiment, the acid treatment may be performed on the carbon nanotube (e.g., single-wall carbon nanotube) that forms at least one of the electrode layer and the electrode leading-out terminal. A research shows that after the acid treatment, the conductivity of the carbon nanotube film may be improved, and the resistivity of the film with transmittance of 80% may be reduced from 500 Ω/sq to 70 Ω/sq. In addition, if SWCNTs, which are dispersed by a mixed solution of 1-propanol aqueous solution and perfluoro sulfonated resin (Nation), are coated on the flexible substrate to form a film, the conductivity is improved due to the effect of P-type doping, and a film having a resistivity of 100 Ω/sq and a light transmittance of 80% is obtained through further optimization, which meets specifications of mass production.

Figure 3:
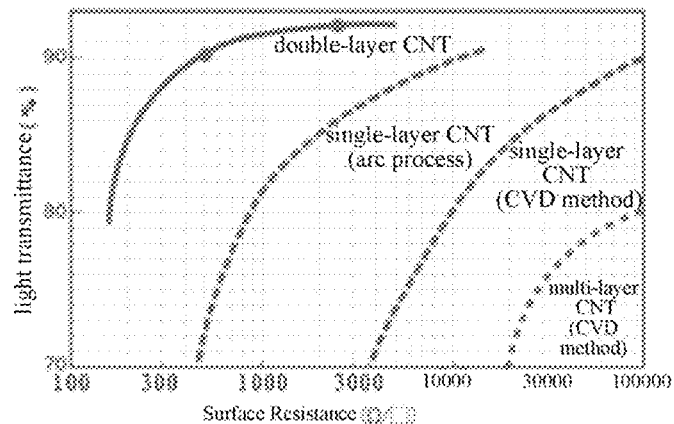
FIG. 3 shows a curve diagram of the light transmittance (%) versus surface resistance ($\Omega$) of different carbon nanotubes.

In addition, FIG. 3 shows a curve diagram of the light transmittance (%) versus surface resistance (Ω) of different carbon nanotubes. As can be seen from FIG. 3, the double-layer CNT has greater advantages in both light transmittance and conductivity over other CNTs. Therefore, optionally, in embodiments of the present disclosure, the double-layer CNT may be adopted to form an electrode layer and an electrode leading-out terminal.

It will be understood by those skilled in the art that, the materials and processes described above for forming the piezoelectric part 101, the first substrate 102, the second substrate 103, the first electrode layer 104 and the second electrode layer 105 are not limited to those described in the above embodiments, which may also be other types of materials and processes, as long as it is possible to ensure that the formed piezoelectric element has at least one of good elasticity, biocompatibility and sensitivity.

Figure 4:
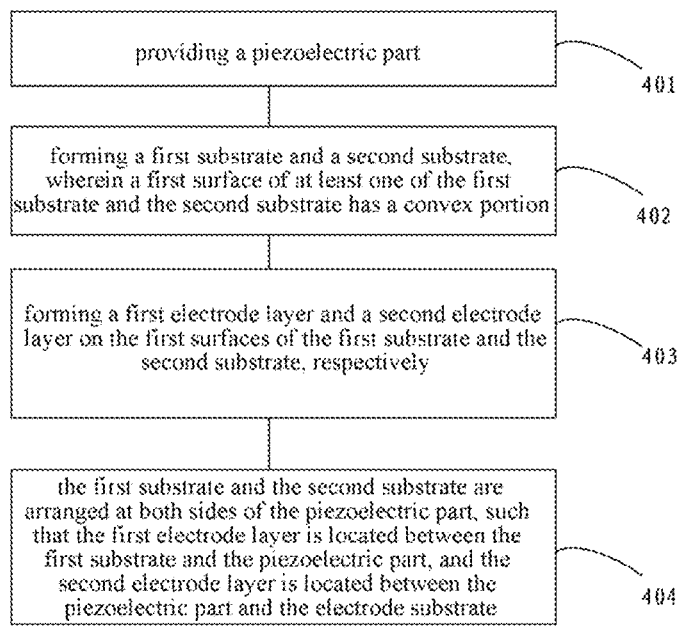
FIG. 4 shows a flow chart of a method for manufacturing a piezoelectric element according to an embodiment of the present disclosure.

In another embodiment of the present disclosure, there is further provided a method for manufacturing a piezoelectric element. FIG. 4 shows a flow chart of a method for manufacturing a piezoelectric element according to an embodiment of the present disclosure. The method comprises following steps.

S401: a piezoelectric part is provided.

S402: a first substrate and a second substrate are formed, and a first surface of at least one of the first substrate and the second substrate has a convex portion.

S403: a first electrode layer and a second electrode layer are formed on the first surfaces of the first substrate and the second substrate, respectively.

In an embodiment, a surface shape of the first electrode layer may be adapted to a shape of the surface having a convex portion of the first substrate on which the first electrode layer is positioned, for example, to make the first electrode layer be affixed to the surface having a convex portion of the first substrate; and a surface shape of the second electrode layer may be adapted to a shape of the surface having a convex portion of the second substrate on which the second electrode layer is positioned, for example, to make the second electrode layer be affixed to the surface having a convex portion of the second substrate.

S404: the first substrate and the second substrate are arranged at both sides of the piezoelectric part, such that the first electrode layer is located between the first substrate and the piezoelectric part, and the second electrode layer is located between the piezoelectric part and the electrode substrate.

Through the piezoelectric element formed by the above-described method, since a convex portion is provided on the formed first substrate and the second substrate, and the first electrode layer and the second electrode layer are provided on the first surface having the convex portion of the substrate, respectively, thus, the substrate is susceptible to deformation in a case when a pressure is applied, so that the pressure is transferred to the piezoelectric part, and the piezoelectric part produces a piezoelectric effect, and then the current generated by the piezoelectric effect is supplied to the load through the electrode. Because the piezoelectric element formed by this method may produce an electric phenomenon even under a small pressure, the sensitivity of the piezoelectric element is high.

In one embodiment of the present disclosure, the method for forming the piezoelectric element may further comprise:

forming the first electrode leading-out terminal and the second electrode leading-out terminal by a spraying process, which are electrically connected to the first electrode layer and the second electrode layer, respectively.

In one embodiment, the convex portion may be formed on the first surface of at least one of the first substrate and the second substrate by any one of following manners.

The first manner: the convex portion and at least one of the first substrate and the second substrate are integrally formed by molding.

For example, by disposing the material forming the substrate in a mold having a groove, and then processing with a physical or chemical method, the convex portion and main bodies of the above two substrates are integrally formed.

The second manner: the first substrate, the second substrate and the convex portion are formed respectively, and then the convex portion is bonded to the first surface of at least one of the first substrate and the second substrate, for example, the convex portion may be bonded to the first surfaces of the first substrate and the second substrate by a glue.

The third manner: the convex portion is formed by removing a part of at least one of the first substrate and the second substrate.

It is to be noted that, it is described herein that the first substrate and the second substrate are formed by the same method. However, it should be understood that it is also possible to form the first substrate and the second substrate by different methods, respectively.

In one embodiment, the first electrode layer and the second electrode layer may be formed on the first surfaces of the first substrate and the second substrate, respectively, by immersing the first substrate and the second substrate in a carbon nanotube solution for a predetermined time period, or the first electrode layer and the second electrode layer are formed, by forming a carbon nanotube layer on the first surfaces of the first substrate and the second substrate via a spraying process.

In one embodiment, the first electrode layer and the second electrode layer may be adhered to both sides of the piezoelectric part by a conductive paste, respectively, so that the first electrode layer and the second electrode layer are arranged at both sides of the piezoelectric member, respectively.

It should be noted that, the method for manufacturing the piezoelectric element according to embodiments of the present disclosure corresponds to the piezoelectric element provided in the above embodiments, and therefore, in above embodiments of the piezoelectric element, illustrations of positions, shapes, formation materials, manufacturing processes, and the like of respective parts are also applicable to embodiments of the manufacturing method, which will not be repeated herein.

Figure 5:
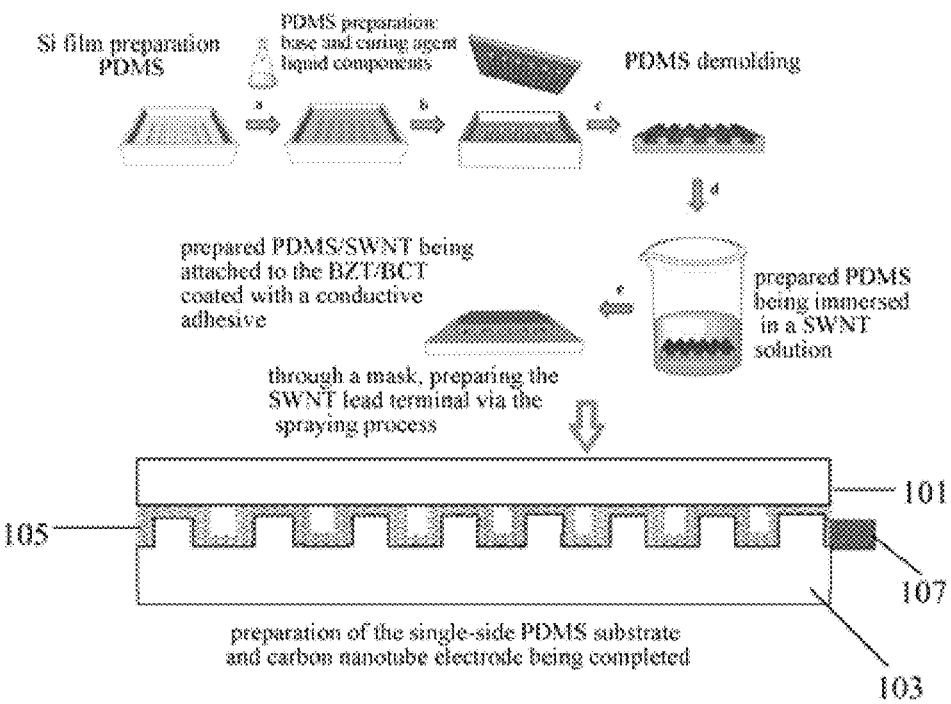
FIG. 5 shows a schematic diagram of a process flow of a method for manufacturing a piezoelectric element according to an embodiment of the present disclosure.

FIG. 5 shows a schematic diagram of a process flow of a method for manufacturing a piezoelectric element according to an embodiment of the present disclosure.

Firstly, two groups of single-side PDMS substrate and carbon nanotube electrode are fabricated. As shown in FIG. 5, the single-side PDMS substrate and the carbon nanotube electrode will be prepared using a front-end method similar to micro-contact printing.

Generally, a main agent (base) and a hardening agent (curing agent) of the PDMS are uniformly mixed at a mass ratio of 10:1, and bubbles in the mixed solution are floated to a surface and ruptured by means of vacuumizing, and then baked in an oven of 120° for about an hour. After the PDMS is cured and demolded, it is immersed in a carbon nanotube solution. After 24 hours, the carbon nanotubes will be wrapped on the PDMS substrate, and a carbon nanotube electrode is formed. Then, the prepared upper and lower two groups of PDMS/SWNT electrodes are attached to the piezoelectric ceramic (or thick film) BZT (or BCT) coated with a conductive adhesive. Finally, through a mask, the preparation of the SWNT electrode lead terminal is performed via the spraying process.

According to the piezoelectric element formed according to embodiments of the present disclosure, the process is simple, and is promising for large-scale commercial production in the future.

In yet another embodiment of the present disclosure, there is also provided a piezoelectric sensor, comprising a piezoelectric element as described in the above embodiments. Such a piezoelectric element has high sensitivity, excellent biocompatibility, and the utilization efficiency of the generated charge is relatively high.

It is to be noted that, in the description of the present disclosure, the orientations or positional relationships indicated by terms "upper", "above", "lower", "under", "top", "bottom" are orientations or positional relationships as shown in the drawings, which is only for the purpose of facilitating describing the description and simplifying the description, but is not intended or implied that the device or element referred to must have a specific orientation, and be constructed and operated in a particular orientation. Therefore, it should not be understood as a limitation of the present disclosure. For example, when an element or a layer is referred to as being "on" another element or layer, it may be directly on the other element or layer, or an intermediate element or layer may exist; likewise, when an element or a layer is referred to as "below" another element or layer, it may be directly under the other element or layer, or at least one intermediate element or layer may exist; when an element or a layer is referred to as being "between" two elements or two layers, it may be a unique element or layer between the two elements or two layers, or more than one intermediate element or layer may exist.

In addition, it should also be noted that, when elements of the present application and its embodiments are introduced, articles "a", "an", "that" and "the" are intended to indicate the presence of one or more elements. In the description of the present disclosure, the meaning of "a plurality of" is two or more, unless otherwise specified. The terms "comprise", "include", "contain", and "have" are intended to be inclusive and to indicate that additional elements other than the listed elements may exist. The terms "first", "second" are only for the purpose of description and are not to be construed as indicating or implicit relative importance.

The foregoing is merely a preferred embodiment of the present disclosure and is not intended to limit the present disclosure. Any modifications, equivalent substitutions, improvements, and the like within the spirit and principle of the present disclosure are intended to be encompassed by the protection scope of the present disclosure.

What is claimed is:

1. A piezoelectric element, comprising:
a piezoelectric part;
a first substrate and a second substrate, provided at both sides of the piezoelectric part, respectively;
a first electrode layer, located between the first substrate and the piezoelectric part; and
a second electrode layer, located between the second substrate and the piezoelectric part,
wherein a surface of at least one of the first substrate and the second substrate close to the piezoelectric part is provided with a convex portion, and a cross section of the convex portion perpendicular to at least one of the first substrate and the second substrate has a rectangular shape, and
wherein when the piezoelectric part is deformed due to an external force, polarization phenomenon occurs therein and positive and negative charges are formed on its two opposite surfaces.

2. The piezoelectric element according to claim 1, wherein the first electrode layer is located on a surface of the first substrate and a surface shape of the first electrode layer is adapted to a shape of the surface of the first substrate on which the first electrode layer is positioned; and the second electrode layer is located on a surface of the second substrate and a surface shape of the second electrode layer is adapted to a shape of the surface of the second substrate on which the second electrode layer is positioned.

3. The piezoelectric element according to claim 1, wherein at least one of the first substrate and the second substrate is a flexible substrate or an elastic substrate.

4. The piezoelectric element according to claim 1, wherein the convex portion is of a columnar shape.

5. The piezoelectric element according to claim 4, wherein the convex portions are arranged in an array.

6. The piezoelectric element according to claim 1, wherein the convex portion extends in a plane parallel to a surface of the piezoelectric part, and a concave portion is located between two adjacent convex portions.

7. The piezoelectric element according to claim 1, wherein at least one of the first electrode layer and the second electrode layer is a carbon nanotube electrode.

8. The piezoelectric element according to claim 7, wherein the carbon nanotube electrode comprises a single-wall carbon nanotube electrode.

9. The piezoelectric element according to claim 7, wherein the first electrode layer and the second electrode layer have thicknesses in the range of 30 nm to 70 nm.

10. The piezoelectric element according to claim 1, wherein the first substrate and the second substrate are polydimethylsioxane substrates.

11. The piezoelectric element according to claim 1, wherein the piezoelectric part comprises a piezoelectric ceramic layer comprising at least one of a barium zirconate titanate layer and a barium titanate layer.

12. A piezoelectric sensor, comprising a piezoelectric element, wherein the piezoelectric element comprises:
a piezoelectric part;
a first substrate and a second substrate, provided at both sides of the piezoelectric part, respectively;
a first electrode layer, located between the first substrate and the piezoelectric part; and
a second electrode layer, located between the second substrate and the piezoelectric part,
wherein a surface of at least one of the first substrate and the second substrate close to the piezoelectric part is provided with a convex portion, and a cross section of the convex portion perpendicular to at least one of the first substrate and the second substrate has a rectangular shape, and
wherein when the piezoelectric part is deformed due to an external force, polarization phenomenon occurs therein and positive and negative charges are formed on its two opposite surfaces.

13. The piezoelectric sensor according to claim 12, wherein the first electrode layer is located on the surface of the first substrate and a surface shape of the first electrode layer is adapted to a shape of the surface of the first substrate on which the first electrode layer is positioned; and the second electrode layer is located on the surface of the second substrate and a surface shape of the second electrode layer is adapted to a shape of the surface of the second substrate on which the second electrode layer is positioned.

14. The piezoelectric sensor according to claim 12, wherein at least one of the first electrode layer and the second electrode layer is a carbon nanotube electrode.

15. The piezoelectric sensor according to claim 14, wherein the carbon nanotube electrode comprises a single-wall carbon nanotube electrode.

16. The piezoelectric sensor according to claim 14, wherein the first electrode layer and the second electrode layer have thicknesses in the range of 30 nm to 70 nm.

17. The piezoelectric sensor according to claim 12, wherein the piezoelectric part comprises a piezoelectric ceramic layer comprising at least one of a barium zirconate titanate layer and a barium titanate layer.

* * * * *